(12) United States Patent
Wong (10) Patent No.: US 6,545,293 B2
(45) Date of Patent: Apr. 8, 2003

(54) THIN FILM TRANSISTOR FLAT DISPLAY (75) Inventor: Jia-Fam Wong, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 8 days.

(21) Appl. No.: 09/876,730

(22) Filed: Jun. 7, 2001

(65) Prior Publication Data
US 2002/0038893 A1 Apr. 4, 2002

(30) Foreign Application Priority Data
Sep. 30, 2000 (TW) ......................... 89120361 A (51) Int. Cl.[7] .............................................. H01L 29/04
(52) U.S. Cl. ..................... 257/59; 257/72; 257/347; 349/43
(58) Field of Search .................. 257/59, 72, 347, 257/359; 349/42, 43

(56) References Cited

U.S. PATENT DOCUMENTS

| 5,478,766 | A | | 12/1995 | Park et al. ...................... 437/40 |
| 5,731,856 | A | * | 3/1998 | Kim et al. ...................... 349/43 |
| 5,825,449 | A | * | 10/1998 | Shin ............................ 349/148 |
| 5,867,242 | A | * | 2/1999 | Yao et al. ...................... 349/122 |
| 5,990,986 | A | * | 11/1999 | Song et al. ...................... 349/43 |
| 6,338,989 | B1 | * | 1/2002 | Ahn et al. ....................... 438/158 |
| 6,339,230 | B1 | * | 1/2002 | Lee et al. ...................... 257/88 |
| 2002/0048866 | A1 | * | 4/2002 | Wong ........................ 438/155 |

FOREIGN PATENT DOCUMENTS

JP  9-189924  * 7/1997

* cited by examiner

Primary Examiner—Nathan J. Flynn
Assistant Examiner—Ahmed N. Sefer
(74) Attorney, Agent, or Firm—Ladas & Parry (57) ABSTRACT The thin film transistor (TFT) display includes a gate electrode and a gate pad respectively formed on a transistor area and a bonding pad area, an insulating layer covered over the gate electrode and a first area of the gate pad, a first semiconductor layer covered over the insulating layer, a second semiconductor layer covered over a predetermined area of the first semiconductor layer, and a metal layer covered on the second semiconductor layer to form a source electrode and a drain electrode. A channel is formed between the source and drain electrodes. The TFT display further includes a first conductive layer, a protective layer, and a second conductive layer. The first conductive layer is formed on the drain electrode, the source electrode, and the substrate except for the surface of the gate pad. The protective layer covers the first conductive layer and the first area of the gate pad. The second conductive layer is formed on the area uncovered by the protective layer, the second conductive is connected to the first conductive layer for electrically connect the gate pad and the metal layer.

7 Claims, 8 Drawing Sheets

THIN FILM TRANSISTOR FLAT DISPLAY

BACKGROUND OF THE INVENTION

1. Field of the Invention

The present invention relates to a thin film transistor (TFT). In particular, the present invention relates to a TFT-liquid crystal display (LCD).

2. Description of the Related Art

Currently, a liquid crystal display (LCD) with the advantages of low power consumption, thin thickness, light weight, and low driving voltage, has been put to these practical use, such as personal computers, navigation systems, Gameboys, projectors, view finders and portable machines (watches, electronic calculators, and televisions).

An electric field is applied on the LCD to change the alignment of the liquid crystal (LC) molecules and transmit light through the LC molecules to display images. A TFT-LCD is to use a thin film transistor (TFT) as a switch device, and has the advantages of low power consumption, lightweight, and low driving voltage. However, since the TFT is thinner than traditional transistors, there are seven photolithography steps in the manufacturing process of the TFT resulting in poor yield and high cost. In order to improve the above-mentioned problems, it is needed to develop a manufacturing method for reducing the number of the photolithography process.

Figure 1A:
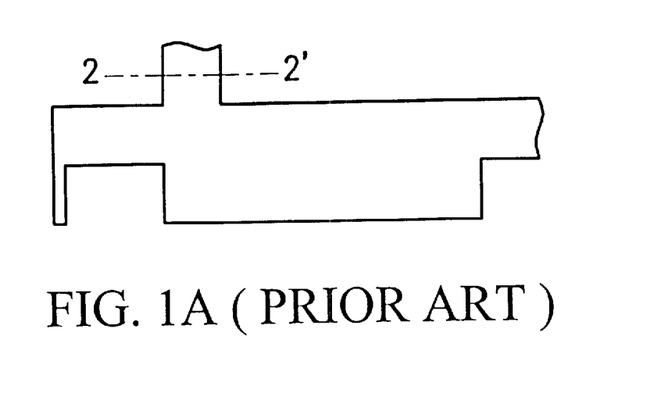
FIGS. 1A to 1C are top views of the manufacturing process for the TFT display in the prior art.
Figure 1B:
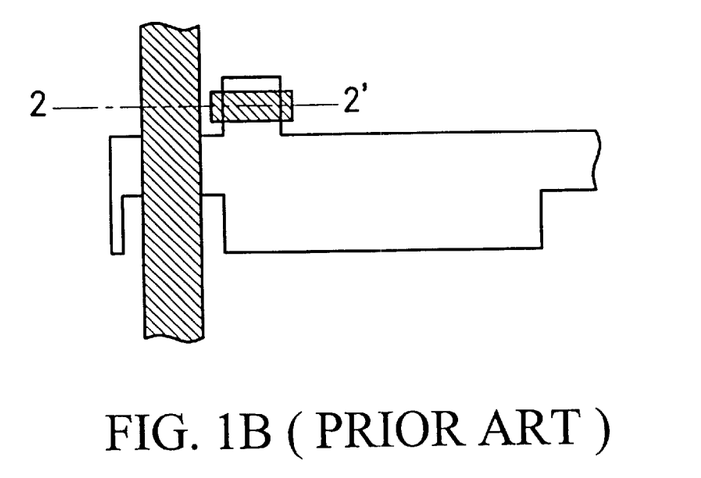
Figure 1C:
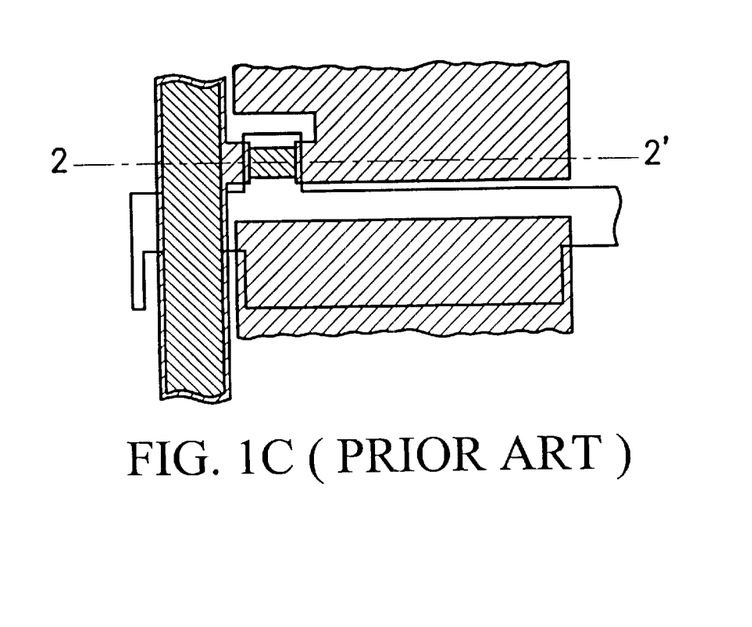
Figure 2A:
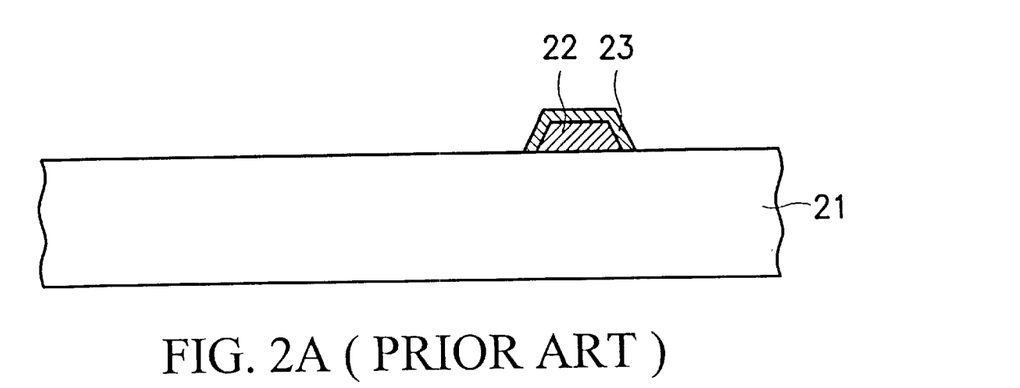
FIGS. 2A to 2E are the cross-sectional diagrams along the line 2–2' in FIG.1 to show the TFT-LCD structure in the prior art.
Figure 2B:
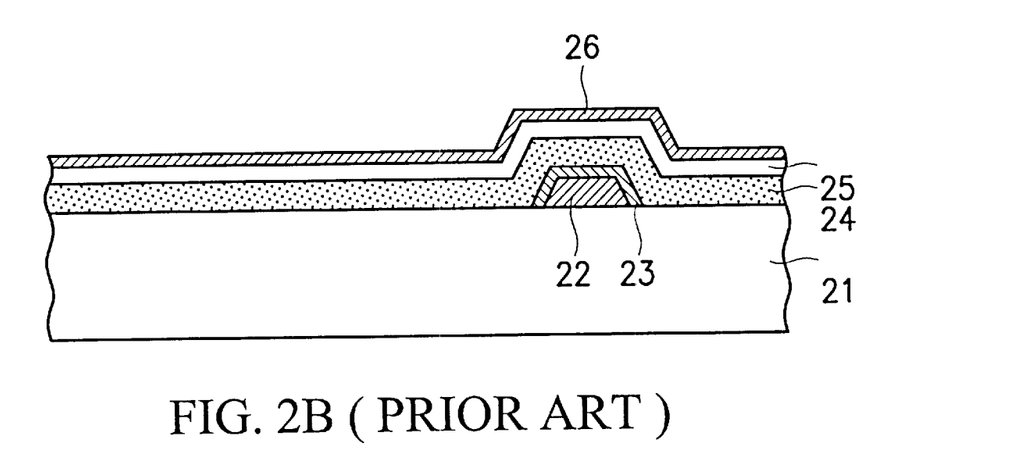
Figure 2C:
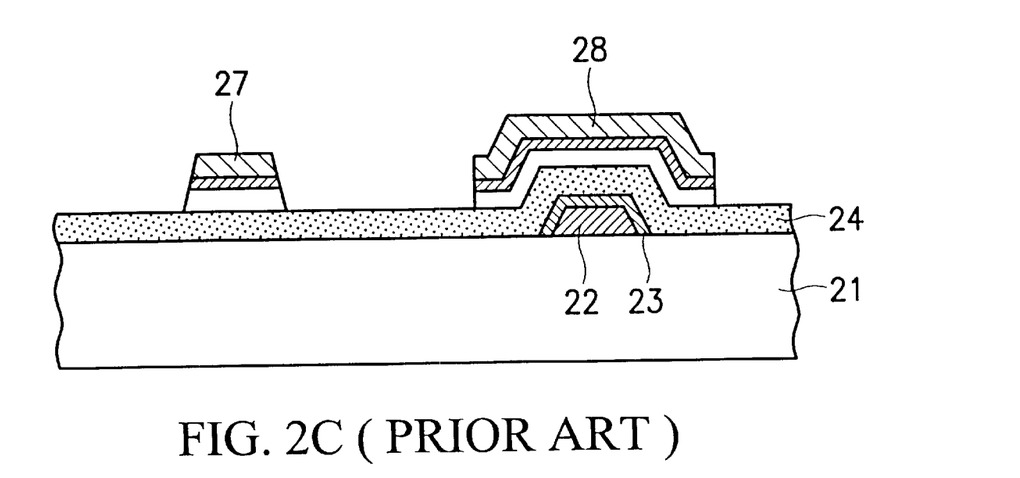
Figure 2D:
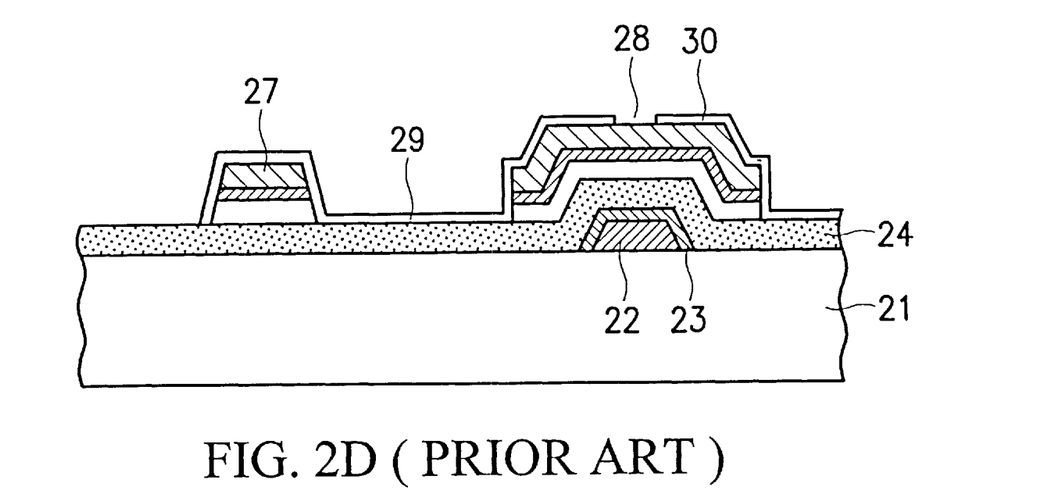
Figure 2E:
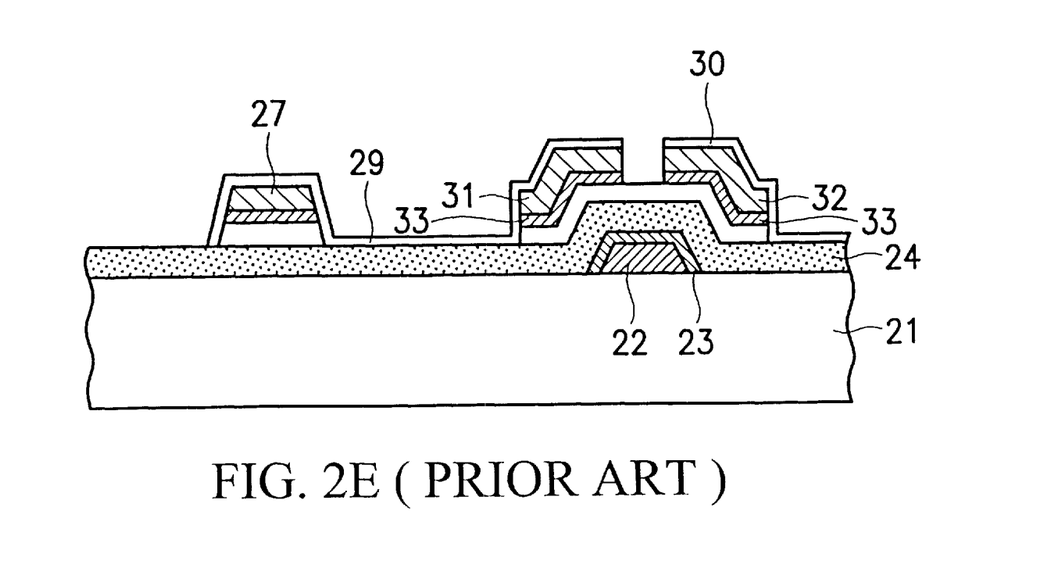

U.S. Pat. No. 5,478,766 disclosed a process for forming a TFT-LCD by using at least four photolithography processes. Referring to FIG. 1 and FIG. 2, FIGS. 1A to 1C show top views of the masks in the process, and FIGS. 2A to 2E are the cross-sectional diagrams along the line 2–2' in FIG. 1 according to the prior art. First, as shown in FIG. 1A and FIG. 2A, a first metal layer is deposited and patterned on a substrate 21 for forming a gate electrode 22 and a gate line connected to the gate electrode 22 by a first photolithography process. Further, a gate insulating layer 23 is covered on the gate electrode 22. Then, as shown in FIG. 2B, an insulating layer 24, an amorphous silicon (a-Si) layer 25, and a doped silicon layer 26 are deposited on the substrate 21. As shown in FIGS. 1B and 2C, a second metal layer is further deposited on the doped silicon layer 26. The second metal layer is then patterned to form a signal line 27 and a source/drain metal layer 28 by a second photolithography process. Referring to FIGS. 1C and 2D, an indium tin oxide (ITO) layer is deposited and patterned on the substrate 21 by performing a third photolithography process. The ITO layer includes a signal line area 29 and a pixel area 30. Finally, a fourth photolithography process is performed to remove parts of the source/drain metal layer 28 and the doped silicon layer 26 which are not covered by the ITO layer. Accordingly, as shown in FIG. 2E, the remaining second metal layer and amorphous silicon layer 26 respectively form a source electrode 31, a drain electrode 32, and a contact layer 33.

According to the above-mentioned process, the 4-mask photolithography process can improve the yield and reduce the cost. However, the first metal layer is not connected to the second metal layer in the prior art. That is, a protecting circuit is not formed to avoid the damage of electrostatic discharge (ESD) in the prior art. Thus, how to avoid the ESD effect becomes an important issue.

SUMMARY OF THE INVENTION

An object of the present invention is to provide a thin film transistor (TFT) flat display and a method of making the same in order to solve the above-mentioned disadvantages.

The TFT display in the present invention includes a substrate having at least a transistor area and a bonding pad area, and a gate electrode and a gate pad respectively formed in the transistor area and the bonding pad area. The gate pad has a first area and a second area. The display further includes an insulating layer formed on the substrate to cover the gate electrode and the first area of the gate pad, a first semiconductor layer covering the insulating layer, a second semiconductor layer covering a predetermined area of the first semiconductor layer, and a metal layer covering the second semiconductor layer to form a source electrode and a drain electrode. A channel forms between the source electrode and the drain electrode. The display also includes a first conductive layer formed on the drain electrode, the source electrode, and the substrate except for the surface of the gate pad, a protective layer formed on the transistor area and the bonding pad area, and a second conductive layer formed on the area uncovered by the protective layer and the second area of the gate pad. The protecting layer fills in the channel and covers the first conductive layer above the source electrode, the drain electrode, and the first are of the fate pad. Further, the second conductive layer connects to the first conductive layer for electrically connecting the gate pad and the metal layer.

It is an advantage of the present invention that the TFT display can provide a protective circuit for preventing the ESD effect.

This and other objectives of the present invention will no doubt become obvious to those of ordinary skill in the art after having read the following detailed description of the preferred embodiment which is illustrated in the various figures and drawings.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Please refer to FIG. 3 and FIG. 4. FIGS. 3A to 3E are top views of a method for forming a TFT-LCD in the present invention. FIGS. 4A to 4E are cross-sectional diagrams along line I–I', II–II' and III–III' of FIG. 3. In FIG. 4, I area shows the cross-sectional diagram along the line I–I', II area shows the cross-sectional diagram along the line II–II', and III area shows the cross-sectional diagram along the line III–III'. First, a substrate 41 is provided and includes a transistor area (TFT area, area I), a capacitor area (area II), and a gate pad area (area III). As shown in FIGS. 3A and 4A, a first metal layer is deposited patterned on the substrate 41 for forming a gate electrode 42, a gate line 43, and a gate pad 44 by a first photolithography process. The gate electrode 42 is formed on the TFT area, the gate line 43 is connected to the gate electrode 42, and the gate pad 44 is positioned at the end of the gate line 43.

Figure 3A:
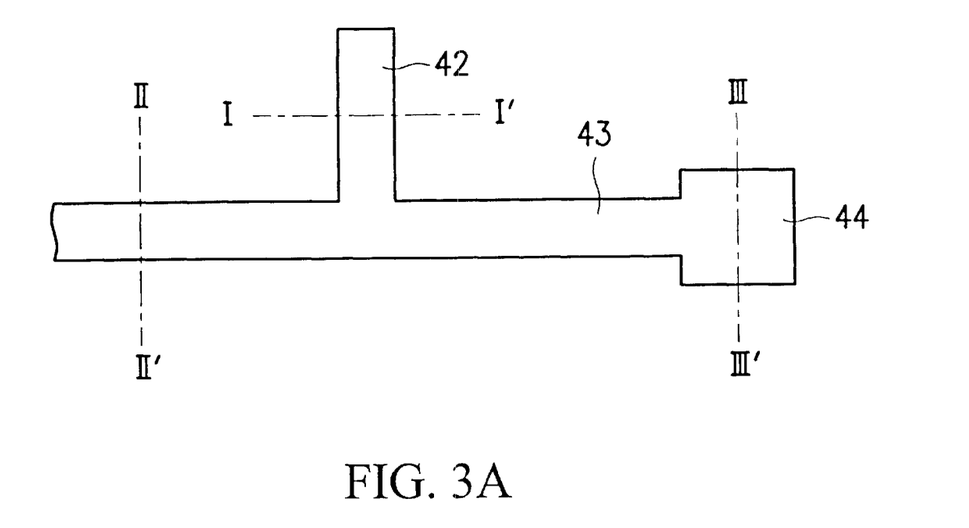
FIGS. 3A to 3E are top views of a method of forming a TFT display according to the present invention.
Figure 3B:
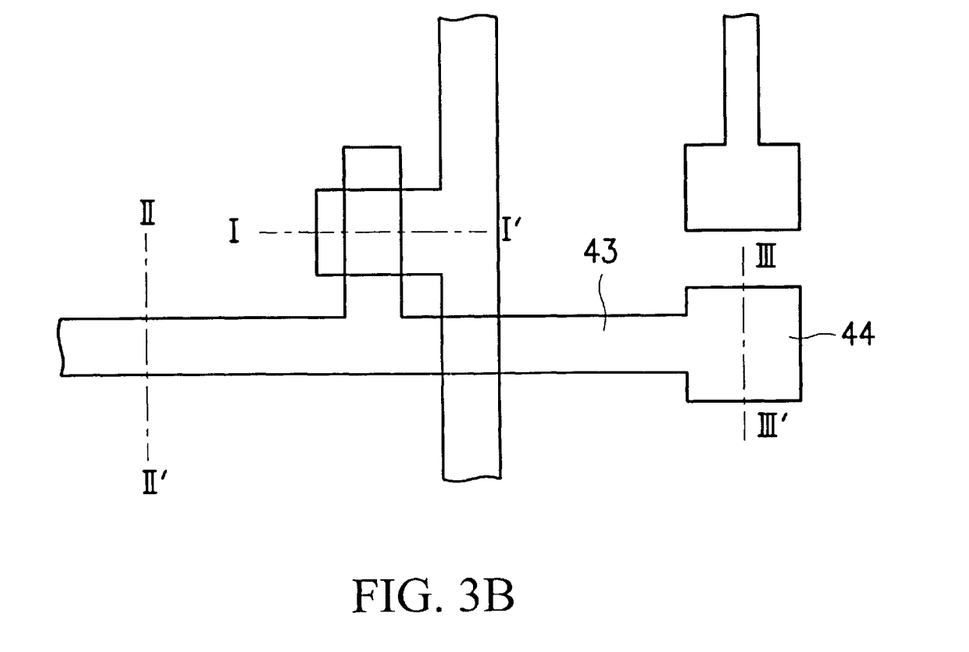
Figure 4A:
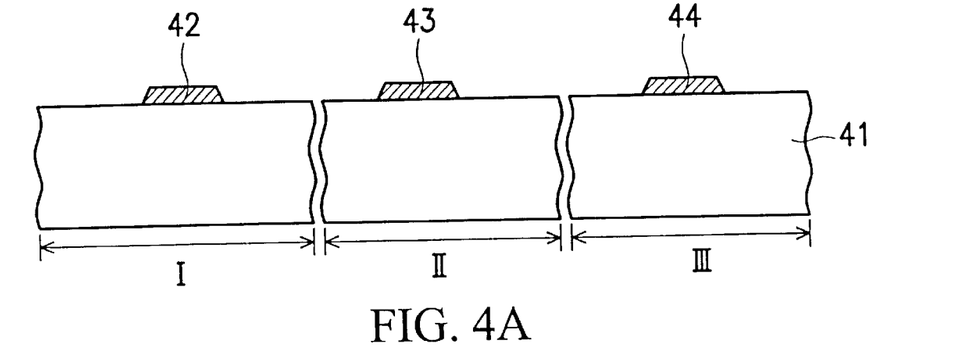
FIGS. 4A to 4E are cross-sectional diagrams of FIGS. 3A to 3E along line I–I', II–II' and III–III'.
Figure 4B:
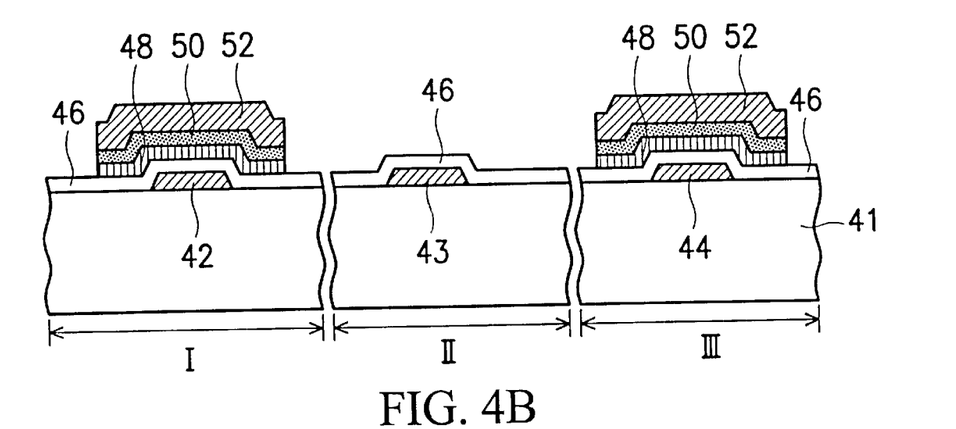

As shown in FIGS. 3B and 4B, a gate insulating layer 46, a first semiconductor layer 48, a second semiconductor layer 50, and a second metal layer 52 are sequentially formed on the substrate 41. The first semiconductor layer 48 is preferably made of amorphous silicon (a-Si), and the second semiconductor layer 50 is preferably made of doped silicon. Next, a second photolithography process is performed to remove a predetermined area of the second metal layer 52, the second semiconductor layer 50, and the first semiconductor layer 48. As the result, an island structure is formed in the TFT area and the gate pad area.

Figure 3C:
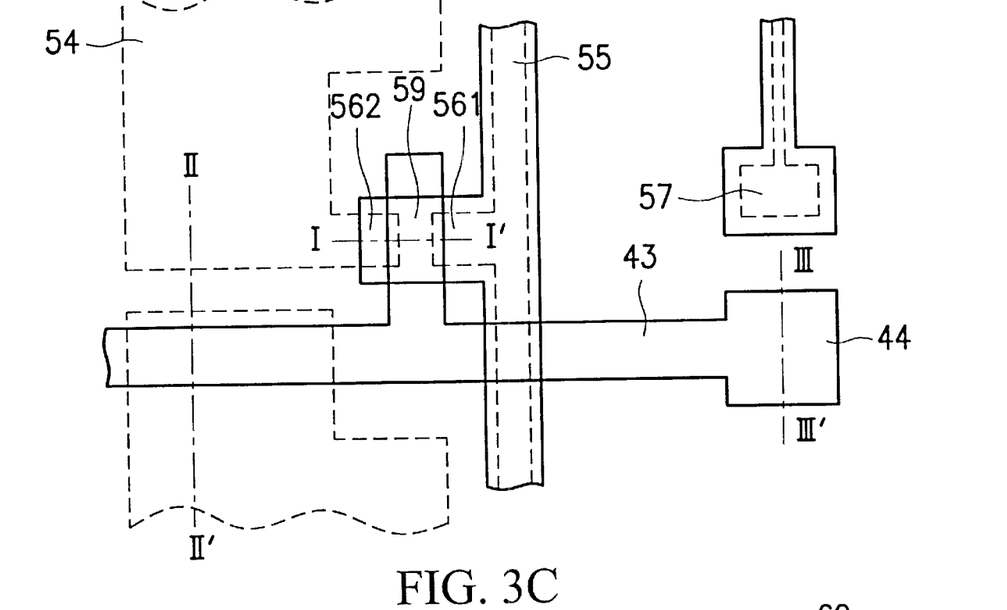
Figure 4C:
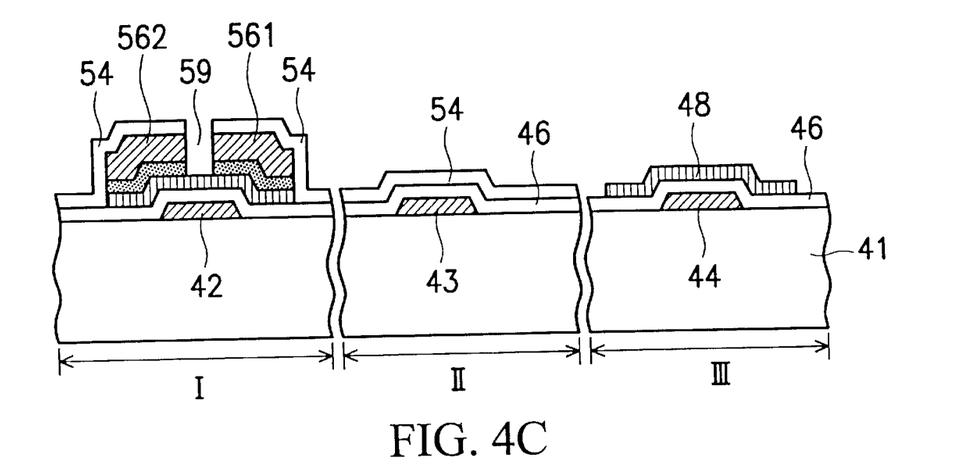

As shown in FIG. 3C and FIG. 4C, a predetermined area on the substrate 41 is defined as a pixel area, and a first conductive layer 54 is formed and patterned on the predetermined pixel area to serve as a pixel electrode. Then, a third photolithography process is performed to remove parts of the second metal layer 52 and the second semiconductor layer 50 which are not covered by the first conductive layer 54. The first conductive layer can be transparent. Therefore, a signal line 55, and a source/drain electrodes 561, 561 are formed. A channel 59 is formed between the source electrode 561 and the drain electrode 562, and also penetrates the first conductive layer 54, the second metal layer 52, and the second semiconductor layer 50. The signal line 55 is perpendicular to the gate line 43, and the end of the signal line 55 is a signal pad 57. Furthermore, at the gate pad area, the second metal layer 52 and the second semiconductor layer 50 are completely removed to expose the first semiconductor layer 48.

Figure 3D:
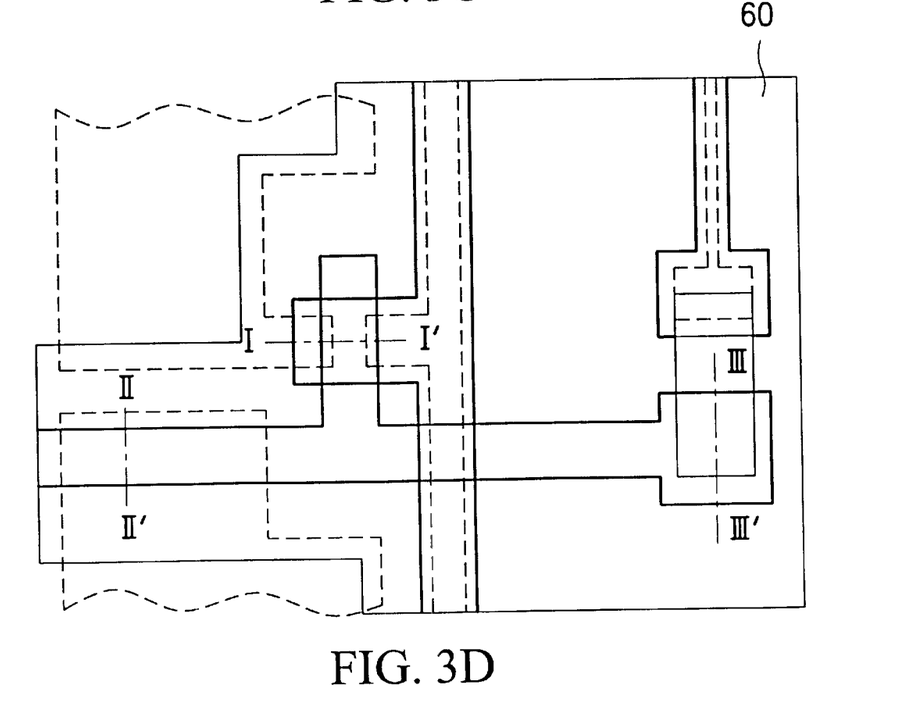
Figure 4D:
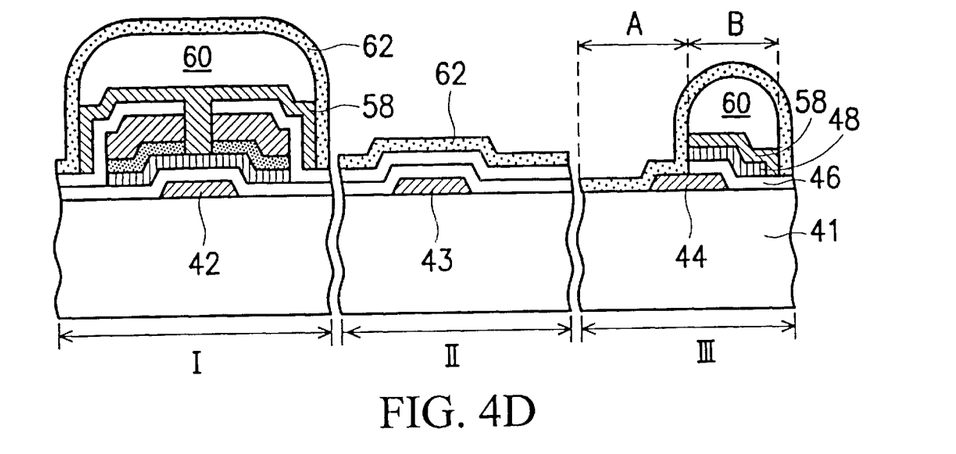

As shown in FIGS. 3D and 4D, a protective layer 58 is deposited on the substrate 41 and fills the channel 59 Then, a patterned photoresist 60 is formed above the protective layer 58 to cover the TFT area I and a part of the gate pad area III. The gate pad area includes area A and area B, and the patterned photoresist 60 only covers the area B of the gate pad area III. Next, a fourth photolithography process is performed to remove parts of the protective layer 58, the first semiconductor layer 48, and the gate insulating layer 46 uncovered by the patterned photoresist 60 in the area A of the gate pad area III. Accordingly, the substrate 41 in the area A as well as the substrate 41 between the signal pad 57 and the gate pad 44 are all exposed. Next, a second conductive layer 62 is deposited to cover the patterned photoresist 60 of the TFT area I, the first conductive layer 54 of the capacitor area II, the area A of the gate pad area III, and the patterned photoresist 60 on the area B of the gate pad area III.

Figure 3E:
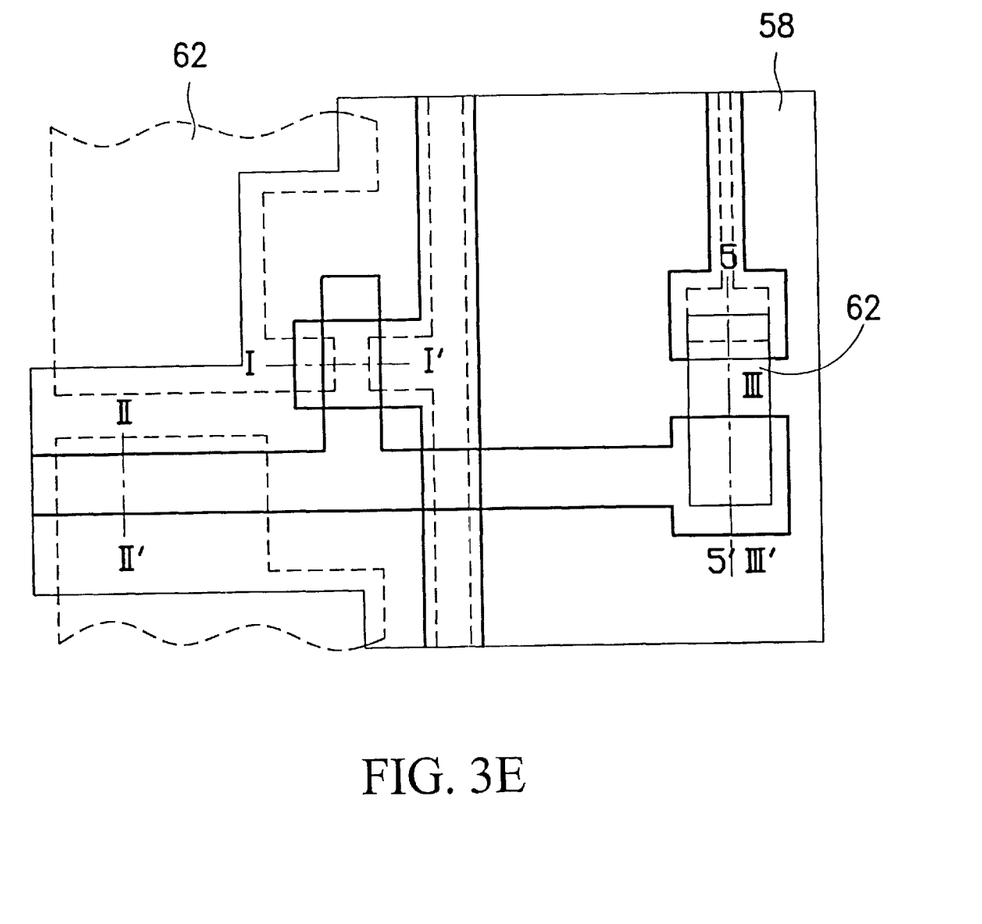
Figure 4E:
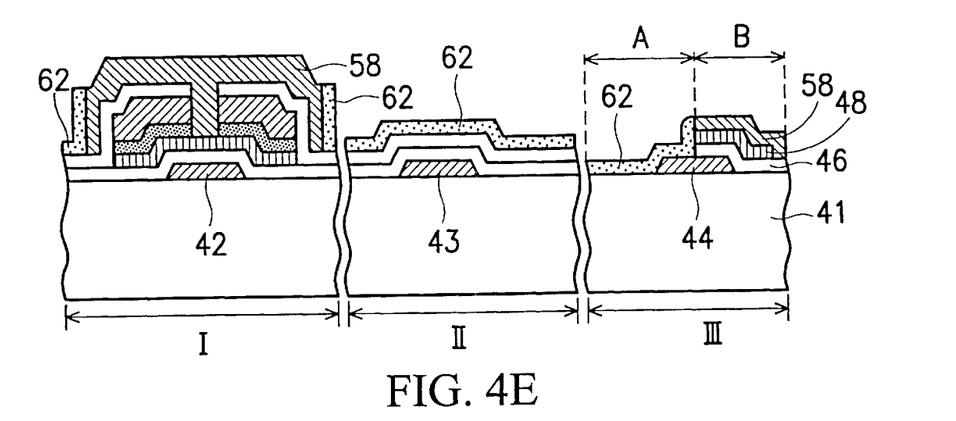

Finally, as shown in FIGS. 3E and 4E, a lift-off process is used to remove the second conductive layer 62 above the patterned photoresist 60 and the patterned photoresist 60 itself. As a result, the remaining second conductive layer 62 covers the sidewall of the protective layer 58 and the exposed surface of the first conductive layer 54 in the TFT area I. Besides, the remaining second conductive layer 62 only covers the area A of the gate pad 44 and the exposed surface of the substrate 41, and does not cover the area B in the gate pad area III.

Figure 5:
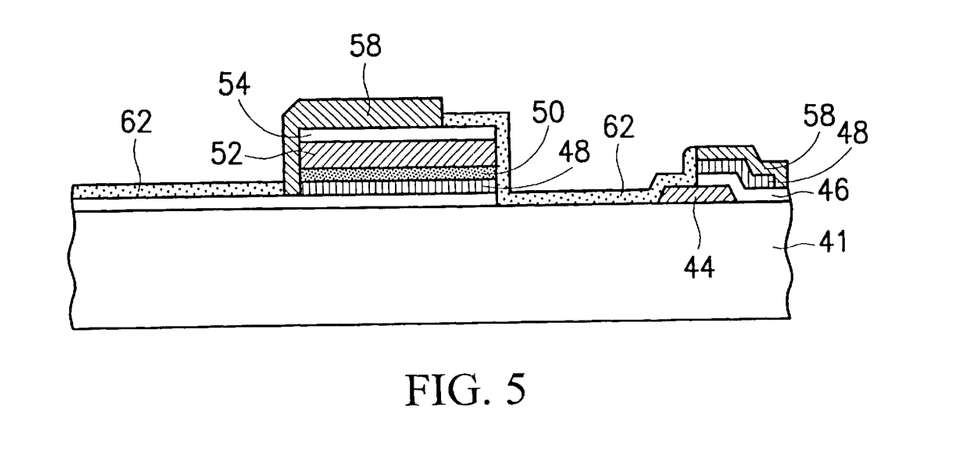
FIG. 5 shows a cross-sectional diagram along the line 5–5' shown in FIG. 3E.

Referring to FIG. 5, it shows a cross-sectional diagram along the line 5–5' shown in FIG. 3E. After the lift-off process, the second conductive layer 62 covers the exposed surface of the gate pad 44, extends to the exposed surface of the substrate 41 between the signal pad 57 and the gate pad 44, and connects to the first conductive layer 54. Besides, the protective layer 58 covers the sidewall of the second metal layer 52. Consequently, the gate pad 44 can electrically connect with the second metal 52 by the second conductive layer 62, and a protective circuit is provided to avoid the ESD effect.

According to the above-described method, the present invention also provides a TFT display structure. The TFT display includes substrate having at least a transistor area and a bonding pad area, and a gate electrode and a gate pad respectively formed on the transistor area and the bonding pad area. The gate pad has a first area and a second area. The display further includes an insulating layer formed on the substrate to cover the gate electrode and the first area of the gate pad, a first semiconductor layer covering the insulating layer, a second semiconductor layer covering a predetermined area of the first semiconductor layer, and a metal layer covering the second semiconductor layer to form a source electrode and a drain electrode. A channel is formed between the source and the drain electrodes. The display also includes a first conductive layer , a protect layer, and a second conductive layer. The first conductive layer is formed on the surface of the drain electrode, the source electrode, and the substrate except for the surface of the gate pad. The protective layer is formed on the transistor area and the bonding pad area, and the protective layer fills into the channel and covers the first conductive layer above the source electrode and the drain electrode, and the first area of the gate pad. The second conductive layer is formed on the area uncovered by the protective layer and the second area of the gate pad, and the second conductive layer is connected to the first conductive layer for electrically connecting the gate pad and the metal layer.

The first semiconductor layer is preferably made of amorphous silicon, the second semiconductor layer is preferably made of doped silicon, and the first and second conductive layers can be transparent and are preferably made of indium tin oxide (ITO).

Compared with the prior art, only four photolithography processes are used in the method for manufacturing TFT in the present invention, the yield of the TFT display can be improved and the cost can be reduced. Also, in the fourth photolithography process of the present invention, the patterned photoresist is sued to remove parts of the protective layer, a first semiconductor layer, and the insulating layer in the gate pad area III. Then, the patterned photoresist and the second conductive layer above the photoresist are removed at the same time by a lift-off process. Therefore, the unwanted second conductive layer can be removed. Furthermore, the second conductive layer overlays part of the first conductive layer, the first conductive layer overlays the source/drain electrodes, so the gate pad can be electrically connected to the second metal layer. This can achieve the aim of providing a protective circuit for preventing the EDS effect. The first and second conductive layer are defined as a pixel electrode. In addition, the second conductive layer is directly formed on the surface of the substrate near the gate pad, therefore the transparency of the pixel electrode is greatly increased and the display quality of the TFT display can be improved.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A thin film transistor (TFT) display, comprising:
   a substrate having at least a transistor area and a bonding pad area;

a gate electrode and a gate pad respectively formed on the transistor area and the bonding pad area, the gate pad having a first area and a second area;

an insulating layer formed on the substrate to cover the gate electrode and the-first area of the gate pad;

a first semiconductor layer covering the insulating layer;

a second semiconductor layer covering a predetermined area of the first semiconductor layer;

a metal layer covering the second semiconductor layer to form a source electrode and a drain electrode, a channel being formed between the source and the drain electrodes;

a first conductive layer formed on the surface of the drain electrode, the source electrode, and the substrate except for the surface of the gate pad;

a protective layer formed on the transistor area and the bonding pad area, the protective layer filled into the channel and covering the first conductive layer above the source electrode and the drain electrode, and the first area of the gate pad; and a second conductive layer formed on the area uncovered by the protective layer and the second area of the gate pad, the second conductive layer connected with the first conductive layer for electrically connecting the gate pad and the metal layer, wherein the second conductive layer covers the second area of the gate pad and the first conductive layer on the transistor area, and the first conductive layer covers the surface and sidewall of the metal layer on the transistor area so that the gate pad is electrically connected to the metal layer by the first and the second conductive layers.

2. The TFT display as claimed in claim 1, wherein the substrate further comprises a gate line, and the end of the gate line is the gate pad.

3. The TFT display as claimed in claim 2, wherein the substrate further comprises a signal line being perpendicular to the gate line and formed by the metal layer, and a signal pad is formed at the end of the signal line.

4. The TFT panel display as claimed in claim 3, wherein the second conductive layer covers the gate pad and the signal pad to electrically connect the gate line and the signal line.

5. The TFT display as claimed in claim 1, wherein the first and the second conductive layers are made of indium tin oxide (ITO).

6. The TFT display as claimed in claim 1, wherein the first semiconductor layer is made of amorphous silicon (a-Si).

7. The TFT display as claimed in claim 1, wherein the second semiconductor layer is made of $n^+$ doped silicon.

* * * * *